United States Patent [19]

Alemanni

[11] 4,379,505

[45] Apr. 12, 1983

[54] INTEGRATED CIRCUIT CARRIER

[75] Inventor: James C. Alemanni, Oceanside, Calif.

[73] Assignee: Gibson-Egan Company, Duarte, Calif.

[21] Appl. No.: 313,000

[22] Filed: Oct. 20, 1981

[51] Int. Cl.³ .................. B65D 73/02; B65D 85/42
[52] U.S. Cl. ................................ 206/329; 206/331; 206/332; 206/560
[58] Field of Search ............. 206/329, 331, 332, 334, 206/560, 562, 563, 564

[56] References Cited

U.S. PATENT DOCUMENTS 3,652,974   3/1972   Tems ................................ 206/329

FOREIGN PATENT DOCUMENTS 384748   10/1973   U.S.S.R. ......................... 206/329

Primary Examiner—Joseph Man-Fu Moy
Attorney, Agent, or Firm—Christie, Parker & Hale

[57]  ABSTRACT

A one-piece integrated circuit carrier includes a base having a central opening bounded on opposite ends by walls having a plurality of narrow grooves for receiving the leads of an integrated circuit flat pack inserted in the carrier. Resilient retaining fingers at the corners of the central opening extend diagonally into the opening. The tips of the fingers have flanges adapted to fit over the outermost leads of the flat pack. Opposite bottom edges of the flat pack rest on a pair of ridges extending along opposite sides of the opening between the end walls of the carrier. The flat pack is inserted in the carrier by first pushing upwardly on the bottoms of the resilient retaining fingers with a set of vertical pins to spread the fingers apart sufficiently to allow the body of the flat pack to be inserted in the opening, with the outermost leads of the flat pack bypassing the fingers so the leads can be inserted in the grooves at opposite ends of the opening. Upon release of the applied vertical force, the retaining fingers return to their normal position in which the flanges at the tips of the fingers extend over the tops of the outermost leads to retain the flat pack in the carrier. Advantages are provided in retaining the flat pack by contact with the leads rather than the body of the flat pack.

10 Claims, 7 Drawing Figures

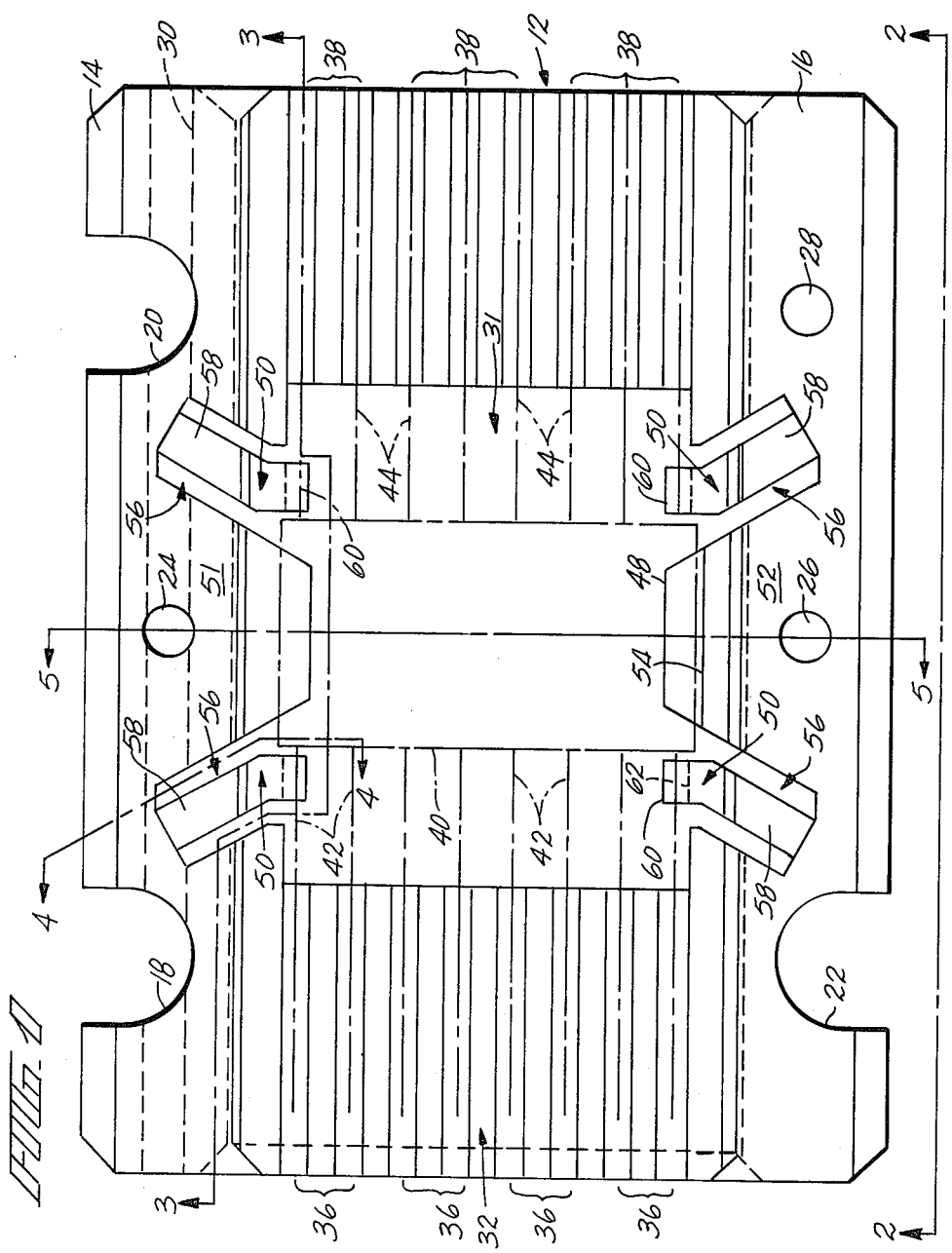

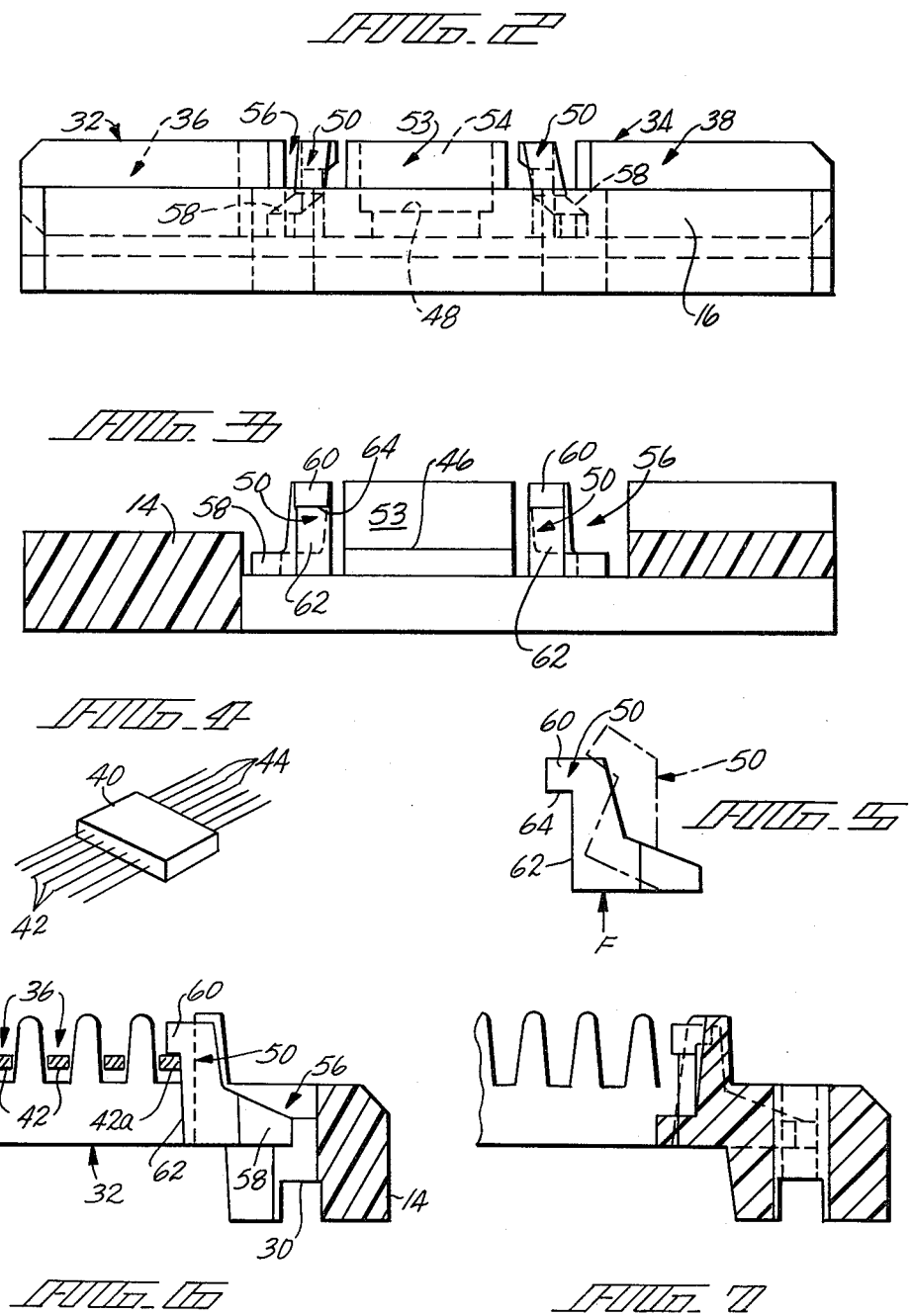

INTEGRATED CIRCUIT CARRIER

FIELD OF THE INVENTION

This invention relates to a carrier for a flat pack type integrated circuit having a body with a number of parallel leads projecting from opposite ends of the flat pack body. More particularly, the invention relates to a carrier that connects to the leads rather than the body of the flat pack.

BACKGROUND OF THE INVENTION

Integrated circuit flat packs are exceedingly small. They are manufactured in the millions and are commonly placed in individual carriers that protect them during subsequent handling steps. While in the carriers, the integrated circuit flat packs can be marked and tested, for example.

Presently known integrated circuit carriers can require rather complex mechanisms for inserting the integrated circuit flat packs into the carriers. Carriers that connect to the body of the integrated circuit can interfere with subsequent marking of the flat pack body. Carriers that connect to the body of the integrated circuit also can experience difficulty in properly connecting to the body of the integrated circuit or they can inadvertently rupture the seal of a flat pack body which tends to be brittle.

It is a common practice to remove integrated circuit flat packs from their carriers to mechanically bend the leads into desired configurations for subsequent connection to printed circuit boards. The integrated circuits, after the leads are bent, are commonly placed in trays, rather than being reinserted into their individual carriers. The configurations of presently known carriers prevent integrated circuits, which have had their leads bent, from being reinserted into the carriers. Thus, the carriers are not available to protect the integrated circuits once the integrated circuits are removed and the leads modified.

Presently known integrated circuit carriers are disclosed in U.S. Pat. No. 3,409,861 to Barnes et al., U.S. Pat. No. 3,529,277 to Barnes, and U.S. Pat. No. 3,652,974 to Tems; and the integrated circuit carrier of this invention represents an improvement over these integrated circuit carriers.

The integrated circuit carrier of this invention can be used with a simplified mechanism for inserting the integrated circuit flat pack into the carrier. The carrier connects to the leads of the integrated circuit, rather than the integrated circuit body; and as a result, the integrated circuit body is completely exposed at the top of the carrier for subsequent marking or other handling steps. The carrier also facilitates removal of the flat pack from the carrier, bending of the leads into desired configurations, and re-use of the flat pack carrier by reinserting the flat pack into the carrier. Even though the leads have been bent or otherwise had their configuration modified, the flat pack still can be reinserted into the carrier.

SUMMARY OF THE INVENTION

Briefly, this invention provides a carrier for an integrated circuit flat pack having a body with a plurality of leads projecting from opposite ends of the body. The carrier includes a base having an opening for receiving the body of the flat pack. End walls at opposite ends of the opening have a plurality of grooves for receiving the leads of the flat pack. Resilient retaining fingers on the base extend into corners of the opening. The retaining fingers have flanged tips that project transversely to the length of the grooves at opposite ends of the opening. Separate ridges on the base extend into opposite sides of the opening for holding the bottom of a flat pack body inserted into the opening. The retaining fingers are bendable away from the opening, under application of an external bending force, for allowing the leads of the flat pack to bypass the bent retaining fingers and fit into the grooves at the opposite ends of the opening. The retaining fingers return to a normal locking position, when the bending force released, for fitting the flanged tips over the adjacent leads of the flat pack for retaining the flat pack in the opening of the carrier.

In one embodiment, the retaining fingers are arranged on the base of the carrier so that the fingers extend from the base toward the flat pack and over only the outermost leads of the flat pack. The fingers contact the leads close to the flat pack body, where the leads have the greatest stiffness. The remainder of the opening in the carrier is entirely open, unobscured by any means for connecting to the flat pack.

These and other aspects of the invention will be more fully understood by referring to the following detailed description and the accompanying drawings.

DRAWINGS

FIG. 1 is a top plan view showing an integrated circuit carrier according to principles of this invention;

FIG. 2 is an elevation view taken on line 2—2 of FIG. 1;

FIG. 3 is a cross-sectional view taken on line 3—3 of FIG. 1;

FIG. 4 is a cross-sectional view taken on line 4—4 of FIG. 1;

FIG. 5 is a cross-sectional view taken on line 5—5 of FIG. 1;

FIG. 6 is a perspective view illustrating an integrated circuit flat pack to be inserted in the carrier of this invention; and FIG. 7 is a fragmentary elevation view illustrating the bendable retaining fingers of the integrated circuit carrier.

DETAILED DESCRIPTION

An integrated circuit carrier 10 comprises a generally rectangular one-piece structure preferably made of hard plastic. The carrier generally includes a base 12 having first and second flanges 14 and 16 extending along opposite long sides of the base. A pair of spaced apart generally U-shaped slots 18 and 20 are formed in the edge of the first flange, and a single U-shaped slot 22 is formed in the edge of the second flange. A circular depression 24 is formed in the upper surface of the first flange, and a pair of circular depressions 26 and 28 are formed in the upper surface of the second flange. An elongated notch 30 is formed in the undersurface of the first flange. The number, size and positions of the slots, depressions and notches can vary and are merely shown as examples of means that cooperate with various types of mechanized equipment for handling the carrier in a well known manner.

The base has a central opening 31 that is generally rectangular in shape. The base also has end walls 32 and 34 at opposite ends of the opening. A plurality of parallel, narrow, elongated grooves 36 are formed between upstanding, elongated ribs on the upper surface of the one end wall; and an identical number of parallel, narrow, elongated grooves 38 are formed between upstanding, elongated ribs on the upper surface of the other end wall. Each of the grooves in one end wall is aligned longitudinally with a corresponding one of the grooves in the other end wall. Each groove is shaped to receive one of the leads of an integrated circuit flat pack to be inserted in the carrier. The illustrated embodiment shows an integrated circuit carrier for a 16-lead integrated circuit flat pack, and therefore there are eight grooves in each end wall of the carrier. The grooves are equidistantly spaced apart, and the spacing between the end walls is greater than the width of the flat pack body. The width of each individual groove is only slightly greater than the width of the leads extending from the integrated circuit.

The carrier provides a means for retaining an integrated circuit flat pack generally of the type illustrated in FIG. 6, which includes an integrated circuit body 40 having a number of long filament-like electrical leads 42 extending parallel to one another from one end of the body and an identical number of parallel electrical leads 44 extending outwardly from the opposite end of the body. In the illustrated embodiment, there are eight leads extending from each end of the integrated circuit body.

The integrated circuit body is held in the opening in the carrier by parallel first and second ridges 46 and 48 spaced apart from one another on opposite sides of the opening 31; and by four separate resilient retaining fingers 50 which project into the opening generally from the four corners of the opening. The body of the integrated circuit flat pack rests on the ridges and the fingers which project into the opening are adapted to extend over and contact the outermost leads of the integrated circuit to hold it in the carrier.

The opening in the carrier is bounded on opposite sides by first and second tapered projections 51 and 52 that project inwardly from the first and second flanges 14 and 16 at opposite sides of the carrier. The first tapered projection 51 has a first upright side wall 53 extending between the fingers on one side of the carrier opening, and the tapered projection 52 at the opposite side has a second upright side wall 54 extending between the fingers at the opposite side of the carrier opening. The upright side walls extend parallel to one another and are adapted to provide contact for opposite side edges of the flat pack inserted in the opening of the carrier. The opposite side edges of the flat pack, which are engaged by the side walls of the carrier, are those edges of the flat pack which extend parallel to the direction of the leads at opposite ends of the flat pack. The position of the body 40 of the flat pack, when inserted in the carrier, is illustrated in phantom lines in FIG. 1. The first and second ridges 46 and 48 are formed as flanges at the ends of the tapered projections which extend into opposite sides of the opening. The ridges face one another and are at the same elevation on opposite sides of the opening 31. Only the bottom outer edges of the flat pack body rest on the ridges 46 and 48 when the flat pack is inserted in the opening in the carrier. The distance which the ridges extend into the opening is limited, preferably to about the same distance that the fingers extend into the opening. That is, the ridges do not extend into the opening beyond the outermost leads of the flat pack.

The tapered projections 51 and 52 on opposite sides of the openings are spaced from the end walls 32 and 34 at opposite ends of the opening. This forms four narrow slots 56 near the four corners of the opening. The slots extend diagonally in directions generally toward the center of the opening 31 in the carrier.

Narrow outer legs 58 of the retaining fingers 50 are formed integrally with portions of the carrier at the base of each diagonal slot. The narrow outer legs of the fingers extend diagonally along each diagonal slot toward the corners of the opening. Generally, at the point where each finger reaches the plane of the adjacent upright side wall 53 or 54, the finger makes a sharp bend and forms a tip that projects into the opening transversely to the length of the grooves 36 and 38 at the opposite end walls of the carrier. The tips of the fingers preferably extend perpendicularly to the length of the grooves at the opposite ends of the carrier, i.e., perpendicularly to the length of the leads 42 and 44 of the flat pack when the flat pack is inserted in the carrier. Separate horizontally extending flanges 60 are formed at the end of the tip of each finger. These flanges project beyond upright faces 62 of each finger which face toward the opening in the carrier. A downwardly facing shoulder 64 is formed between the upright face 62 of each finger and the flange 60 at the top of each finger. As shown best in FIG. 4, when a flat pack body is inserted in the opening in the carrier and the leads from the flat pack are in the grooves of the carrier, the flanged tip of each finger fits over the top of the closest outermost lead and the upright face of the finger contacts the outside of the lead. The outermost lead is referred to at reference numeral 42a in FIG. 4. The flanged tips of the fingers are all at the same elevation and the fingers are all identical in structure.

As illustrated best in FIG. 5, the flanged tips of the fingers on each side of the carrier are aligned vertically with and spaced above the upper surface of the ridge on the carrier side wall between the fingers. This allows the integrated circuit body to rest on the ridges while the outermost leads of the integrated circuit body are simultaneously connected with and retained by the flanged tips of the fingers projecting into the corners of the opening in the carrier. As shown best in FIG. 1, the flanged tips of the fingers on each side of the carrier are spaced apart by a distance just slightly greater than the width of the flat pack body. This allows the fingers to engage the outermost leads adjacent the flat pack body where the leads have the greatest stiffness. This enhances the ability to retain the flat pack in the carrier opening by contact only with the outermost leads. Preferably, the leads do not project into the opening farther than the outermost leads; or stated another way, the tips do not project into the opening farther than the outermost grooves in the end walls of the carrier.

In using the integrated circuit carrier, the integrated circuit flat pack is preferably held by a vacuum head (not shown) attached to the top of the integrated circuit body. The four retaining fingers are simultaneously pushed upwardly by actuating a mechanism that includes four vertical pins (not shown) for applying an upward force at the base of each finger, as illustrated at F in FIG. 7. This bends the fingers simultaneously away from the opening generally to the retracted position of the fingers shown in phantom lines in FIG. 7. The legs of the retaining fingers are long and narrow and the outer ends of the legs make essentially point contact with the base of the carrier. This enables the fingers to rotate backwards under a vertical point force applied at the base of the finger. While the vertical pins are forced upwardly and the resilient fingers are held in their retracted positions the vacuum head is lowered to place the integrated circuit body 40 on the ridges 46 and 48 on opposite sides of the opening. By spreading the resilient fingers apart, away from the corners of the opening, the integrated circuit body is allowed to bypass the flanged tips of the resilient fingers while the leads of the integrated circuit body are being positioned in the grooves at opposite ends of the carrier opening. Once the integrated circuit body is in place in the carrier, the vacuum head is retracted and the vertical force from the pins at the base of the fingers is released. This allows the fingers to immediately return to their normal position; and in this position, the flanged tips of the fingers fit over and adjacent to the outermost leads of the integrated circuit to retain the integrated circuit in the carrier.

Thus, the integrated circuit flat pack is retained in the carrier by connection to the leads rather than the body of the flat pack. This leaves the top of the flat pack body entirely exposed, permitting ease of marking the flat pack body.

The flat pack body can be brittle and therefore is susceptible to damage. By avoiding contact between the flat pack body and any movable retaining means, the chance of damage to the flat pack body is minimized.

The positions of the leads from the flat pack are typically manufactured with extremely low tolerances, commonly within narrower tolerances than the flat pack body itself. Hence, attachment to the leads rather than the body can be more easily controlled by automated equipment.

Automated equipment for inserting an integrated circuit into the carrier also can be simplified, requiring only a two-step process of applying the vertical force to the pins to spread the fingers apart and the application of the vacuum head for placing the integrated circuit on the ridges in the carrier.

The carrier also permits the integrated circuit to be removed from the carrier and have its leads bent into desired configurations and then have the integrated circuit replaced in the carrier. For example, all of the leads of the integrated circuit can be bent, or only alternating leads can be bent in a staggered configuration. Either configuration may be necessary for subsequent attachment to various types of printed circuit boards. Once the leads are bent, the integrated circuit can be picked up by a vacuum head and placed back in the carrier. The remaining straight portions of the leads close to the integrated circuit body can be contacted by the retaining fingers and also can fit into the inner portions of the grooves at opposite ends of the carrier. In presently known carriers having long bars at opposite ends that project across the opening near the end walls of the carrier, the bars will interfere with the bent leads of the flat pack and prevent the flat pack from being reinserted into the carrier.

I claim:

1. A carrier for an integrated circuit flat pack having a body with a plurality of leads projecting from opposite ends of the body, the carrier comprising a base; an opening in the base for receiving the body of the flat pack; end walls at opposite ends of the opening having a plurality of grooves for receiving the leads of the flat pack; resilient retaining fingers on the base extending generally into corners of the opening, the retaining fingers having flanged tips in which the flanges project toward the opening transversely to the length of the grooves at opposite ends of the opening; separate ridges on the base extending into opposite sides of the opening for holding the bottom edges of a flat pack body inserted in the opening; the retaining fingers being bendable away from the opening, under application of an external bending force, for allowing the leads of the flat pack to bypass the bent retaining fingers and fit into the grooves at opposite ends of the opening, the retaining fingers returning to a normal locking position, when the external bending force is released, for positioning the flanged tips of the fingers over adjacent leads of the flat pack for retaining the flat back in the opening of the carrier.

2. Apparatus according to claim 1 in which the opening is generally rectangular and there are at least four separate fingers that project into the four corners of the opening.

3. Apparatus according to claim 1 in which the ridges project into the opening from opposite intermediate side regions of the opening; and in which a separate pair of said retaining fingers project into the opening adjacent opposite ends of each ridge.

4. Apparatus according to claim 3 in which the flanged portions of the fingers extend into the opening at an elevation above their adjacent ridge.

5. Apparatus according to claim 1 in which the end walls of the corner have outermost grooves adapted to receive the outermost leads of the flat pack; and in which the retaining fingers have flanges that are aligned longitudinally with and project inwardly at a elevation above the bottom of the outermost grooves.

6. Apparatus according to claim 5 in which the ridges on opposite sides of the corners are at an elevation below the bottom of the outermost grooves.

7. Apparatus according to claim 1 in which the end walls of the corners have outermost grooves adapted to receive the outermost leads of the flat pack; and in which the retaining fingers project into the opening no farther than their closest outermost grooves.

8. Apparatus according to claim 1 in which the flanged portions of the fingers on each side of the opening are spaced apart by a distance slightly greater than the width of the flat pack body so the flanged portions engage the leads where they have the greatest stiffness.

9. Apparatus according to claim 1 in which the retaining fingers are disposed in separate elongated slots adjacent the opening, each retaining finger having a narrow elongated outer leg portion extending along the slot toward the opening and being bendable in the slot to facilitate mounting the flat pack in the opening.

10. Apparatus according to claim 9 in which the ridges project into the opening from opposite sides of the opening, and in which said retaining fingers project into the opening adjacent opposite ends of the ridges.

* * * * *